US006406983B1

(12) United States Patent
Hölzlein et al.

(10) Patent No.: US 6,406,983 B1
(45) Date of Patent: Jun. 18, 2002

(54) PROCESS FOR THE THERMAL ANNEALING OF IMPLANTATION-DOPED SILICON CARBIDE SEMICONDUCTORS

(75) Inventors: Karlheinz Hölzlein, Höchstadt; Roland Rupp, Lauf; Arno Wiedenhofer, Regensburg, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/538,797

(22) Filed: Mar. 30, 2000

Related U.S. Application Data

(63) Continuation of application No. PCT/DE98/02722, filed on Sep. 14, 1998.

(30) Foreign Application Priority Data

Sep. 30, 1997 (DE) .......................... 197 43 127

(51) Int. Cl.[7] .............................. H01L 21/265
(52) U.S. Cl. ....................................... 438/522
(58) Field of Search ............... 438/522, 105, 438/931

(56) References Cited

U.S. PATENT DOCUMENTS

| | | | |
|---|---|---|---|
| 3,629,011 A | * 12/1971 | Tohi et al. | |
| 5,011,549 A | 4/1991 | Kong et al. | |
| 5,087,576 A | * 2/1992 | Edmond et al. | |
| 5,119,540 A | 6/1992 | Kong et al. | |
| 5,190,890 A | * 3/1993 | Precht et al. | |
| 5,604,135 A | * 2/1997 | Edmond et al. | |
| 5,710,059 A | * 1/1998 | Rottner | |
| 5,981,900 A | * 11/1999 | Flemish et al. | |
| 6,100,169 A | * 8/2000 | Suvorov et al. | |

OTHER PUBLICATIONS

H. Behner et al.: "Surface composition of CVD–grown α–SiC layers—an XPS and LEED study", Applied Surface Science 99 (1996), pp. 27–33.
Mario Ghezzo et al.: "Nitrogen–Implanted SiC Diodes Using High–Temperature Implantation", IEEE Electron Device letters, vol. 13, No. 12, Dec. 1992, pp. 639–641.
Mulpuri V. Rao et al.: "Phosphorus and boron implantation in 6H–SiC", J. Appl. Phys. 81 (10), May 15, 1997, pp. 6635–6641.
Seiji Yaguchi et al.: "Nitrogen Ion Implantation into 6H–SiC and Application to High–Temperature, Radiation–Hard Diodes", Jpn. J. Appl. Phys. vol. 34 (1995), pp. 3036–3042.
T. Kimoto et al.: "Ion–implantation into α–SiC epilayers and application to high–temperature, high–voltage devices", Inst. Phys. Conf. Ser. No. 145, Chapter 4, Aug. 28, 1995, pp. 609–614.

* cited by examiner

*Primary Examiner*—Charles Bowers
*Assistant Examiner*—Stephen W. Smoot
(74) *Attorney, Agent, or Firm*—Herbert L. Lerner; Laurence A. Greenberg; Werner H. Stemer

(57) ABSTRACT

A process for the thermal annealing of implantation-doped silicon carbide semiconductors in a gas stream brings practically no carbon to the silicon carbide semiconductor. In one embodiment, a container, a carrier, radiation shields and a baseplate are composed of a metal or a metal compound such as, for example, tantalum or tantalum carbide, at least at locations which come into contact with the gas stream.

39 Claims, 2 Drawing Sheets

PROCESS FOR THE THERMAL ANNEALING OF IMPLANTATION-DOPED SILICON CARBIDE SEMICONDUCTORS

CROSS-REFERENCE TO RELATED APPLICATION

This application is a continuation of copending International Application No. PCT/DE98/02722, filed Sep. 14, 1998, now WO 99/17345 which designated the United States.

BACKGROUND OF THE INVENTION

Field of the Invention

The invention relates to a process for the thermal annealing of at least one implantation-doped silicon carbide semiconductor in a gas stream.

silicon carbide (SiC), preferably in monocrystalline form, is a semiconductor material with outstanding physical properties which make that semiconductor material of interest particularly for optoelectronics, high temperature electronics and power electronics. While silicon carbide light-emitting diodes are already commercially available, there are not yet any commercial silicon carbide-based power semiconductor components. That is primarily due to the elaborate and expensive production of suitable silicon carbide substrates (wafers) and the more difficult process technology in comparison with silicon.

One of the problems is presented by the doping of monocrystalline silicon carbides. Due to the high temperatures required, which are in excess of 1800° C, it is practically impossible to dope silicon carbide by diffusion, unlike the case with silicon. Monocrystalline silicon carbide is therefore doped either by adding dopants during growth, in particular during sublimation growth (PVD) or chemical vapor deposition (CVD), or by implanting dopant ions (ion implantation).

The implantation of dopant ions in monocrystalline silicon carbide substrates or in a previously grown silicon carbide epitaxial layer allows targeted lateral variation of the dopant concentration, thereby making it possible to produce semiconductor components with a surface patterned in a planar manner. That constitutes a basic precondition for the fabrication of most semiconductor components. However, a problem with doping by implantation is the crystal defects (lattice defects, crystal imperfections) which are created in the silicon carbide crystal of the epitaxial layer by the dopant atoms implanted with high kinetic energy and which impair the electronic properties of the implanted semiconductor region and therefore of the whole component. Moreover, the dopant atoms or atomic residues are not incorporated optimally in the silicon carbide crystal lattice after implantation, and therefore only some of them are electrically activated.

Processes have therefore been developed for annealing the crystal defects created by the implantation by using heat treatment and, at the same time, for obtaining a high activation coefficient of the dopant atoms (so-called thermal annealing).

On one hand, an article in "IEEE Electronic Device Letters", Vol. 13, 1992, pages 639 to 641 discloses a process for the thermal annealing of a 6H-silicon carbide semiconductor region, which is n-doped by implantation of nitrogen ions at high implantation temperatures of between 5000° C., and 1000° C., in a 6H-silicon carbide epitaxial layer that is p-doped with aluminum. In that process, the 6H-silicon carbide semiconductor is treated at a constant annealing temperature of between 1100° C., and 1500° C., in an argon atmosphere. In order to prevent the surface from being destroyed by uncontrolled evaporation with the formation of craters and cavities, the 6H-silicon carbide semiconductor is introduced into a crucible made of silicon carbide. During the heat treatment, the surface of the 6H-silicon carbide semiconductor is in equilibrium with the silicon carbide atmosphere within the crucible.

On the other hand, an article in "Applied Surface Science", Vol. 99, 1996, pages 27 to 33 describes the influence of the gas composition during the cooling operation of a chemical vapor deposition process (LPCVD=Low Pressure Chemical vapor Deposition) on silicon carbide semiconductors. The cooling operation starts at a maximum temperature of 1450° C., which is thus comparable to the temperatures during thermal annealing after ion implantation. Therefore, the results that are obtained can also be transferred to the thermal annealing processes after ion implantation. In the investigations cited, it was ascertained that at temperatures of above 1000° C., in vacuum or under a protective gas, the silicon carbide atomic layers near the surface are depleted of silicon, and a thin graphite layer can form on the surface of the silicon carbide semiconductor. If, on the other hand, the same process is carried out under a pure hydrogen atmosphere, then the result is a virtually stoichiometric surface.

SUMMARY OF THE INVENTION

It is accordingly an object of the invention to provide a process for the thermal annealing of implantation-doped silicon carbide semiconductors, which is improved in comparison with the heretofore-known processes of this general type and in which the formation or the clustering of undesirable crystallographically oriented steps is reduced.

With the foregoing and other objects in view there is provided, in accordance with the invention, a process for the thermal annealing of at least one implantation-doped silicon carbide semiconductor in a gas stream, which comprises holding the at least one silicon carbide semiconductor with a carrier within a container; conducting the gas stream within the container causing the gas stream to contact regions of the carrier and the container; forming the carrier and the container of a material selected from the group consisting of at least one metal and at least one metal compound, at least in the regions; and supplying practically no carbon to the at least one silicon carbide semiconductor through the gas stream.

The annealing process is thus to be configured in such a way that practically no carbon is supplied to the at least one silicon carbide semiconductor through the gas stream. In this connection, "practically no carbon" is to be understood as a smaller proportion of carbon than that which corresponds to the equilibrium partial pressure of carbon or carbon-containing components (e.g. $SiC_2$) over the silicon carbide semiconductor at the respective process temperature.

In this case, the invention is based on the insight that the crystallographically oriented steps which are always present in misoriented silicon carbide surfaces of layers applied epitaxially, for example, or of monocrystalline substrates and which ideally have a height of just one to two monolayers, cluster in an undesirable manner up to a step height of approximately 50 nm (step bunching) due to thermally activated surface redistribution. This takes place if, during the thermal annealing operation, the silicon carbide semiconductor is in equilibrium with a silicon carbide atmosphere or the gas stream supplied contains proportions of carbon which are at least comparable to this equilibrium state. Many small crystallographically oriented steps conglomerate in this case to form a few high crystallographically oriented steps. The small crystallographically oriented steps having a height of approximately two monolayers are an unavoidable consequence of the misorientation of the base silicon carbide crystals which is necessary for epitaxial layer growth. It has been found that the step growth described can be considerably restricted by reducing the proportion of foreign carbon in the gas stream, that is to say the proportion of carbon which is supplied externally to the silicon carbide semiconductor.

Consequently, when the gas stream is provided according to the invention, the step heights which result after thermal annealing are significantly smaller than in the prior art, in particular at least a factor of three smaller.

In accordance with another mode of the invention, at least the surface of the doped region of the silicon carbide semiconductor is exposed to a gas stream which preferably contains at least one inert gas and/or nitrogen and/or hydrogen. The gas stream composition can be changed during annealing, for example from an inert gas composition to a hydrogen-containing composition or even into practically pure hydrogen. Argon or helium with proportions by volume of up to approximately 100% are advantageously used as the inert gases.

In accordance with a further mode of the invention, a preferred variant of the process control resides in effecting heating in an inert gas stream, then maintaining an approximately constant maximum temperature, and subsequently effecting cooling in a gas stream with a proportion of hydrogen of typically at least 50%, in particular more than 80%, and preferably above 95%. Cooling in a hydrogen atmosphere results in a stoichiometrically virtually intact surface of the silicon carbide semiconductor, whereas cooling in e.g. an argon atmosphere may possibly lead to a thin graphite layer on the surface of the silicon carbide semiconductor due to silicon depletion.

In accordance with an added mode of the invention, in order to prevent dopant atoms from exiting from the silicon carbide semiconductor, atoms which have also been used for doping can be added to the gas stream under a predetermined gas partial pressure.

In accordance with an additional mode of the invention, the flow rate of the gas stream is preferably set between approximately 0.5 cm/s and approximately 60 cm/s, in particular between 5 cm/s and 25 cm/s. It has been shown that a silicon carbide semiconductor that is annealed under such a gas stream has a significantly better surface than a silicon carbide semiconductor that is annealed in a gas stream with a different flow rate. The advantage of having a gas stream flowing at the silicon carbide semiconductor during annealing is that, in contrast to the known annealing processes, in spite of the high temperatures, the surface has a good morphological quality, and the crystallographic steps stemming from the misorientation of the silicon carbide surface are essentially preserved and do not cluster to form larger steps, and other surface roughnesses are not produced either. The above-mentioned preferred range for the flow rate ensures that the flow rate on one hand is low enough to avoid impermissible cooling of the silicon carbide semiconductor, and on the other hand is high enough to transport away carbon and silicon atoms exiting from the silicon carbide semiconductor, so that they cannot contribute to undesirable step growth.

In accordance with yet another mode of the invention, the static process pressure in a region of the gas atmosphere adjoining at least the silicon carbide semiconductor is generally advantageously set between approximately 5000 Pa and approximately 100,000 Pa (normal pressure) and preferably between approximately 10,000 Pa and approximately 50,000 Pa. The negative pressure which is set ensures that the undesirable growth of the crystallographically oriented steps is suppressed particularly well.

In accordance with yet a further mode of the invention, the silicon carbide semiconductor is disposed in the interior of a container which can preferably be heated through the use of an HF (High frequency) induction coil. The silicon carbide semiconductor is preferably held by a carrier in the interior of the container.

In accordance with yet an added mode of the invention, at least one radiation shield is placed in the interior of the container, in each case upstream and downstream of the carrier, with reference to the direction of the gas stream, in order to prevent an undesirable radiation of heat from the interior of the container. openings for the passage of the gas stream are preferably provided in the radiation shields.

In accordance with yet an additional mode of the invention, the carrier, the radiation shields and the container, for example at least parts of the inner wall surface of the container, are advantageously composed of at least one metal or at least one metal compound, or are at least lined or covered with the same, at least in the regions which come into contact with the gas stream.

In accordance with again another mode of the invention, the metal or the metal compound should advantageously melt only at a temperature in excess of 1800° C., due to the high process temperatures during thermal annealing.

In accordance with again a further mode of the invention, the metal or the metal compound should advantageously have a vapor pressure of less than $10^{-2}$ Pa (approximately $10^{-7}$ Atm) at the maximum temperature of 1800° C.

In accordance with again an added mode of the invention, the metal or the metal compound should advantageously be resistant to hydrogen due to the proportions of hydrogen that are provided in the gas stream.

In accordance with again an additional mode of the invention, metals or metal compounds which contain at least one of the materials tantalum, tungsten, molybdenum, niobium, rhenium, osmium, iridium or carbides thereof can thus be used with particular advantage. Parts of the container which do not come into contact with that part of the gas stream which reaches the silicon carbide semiconductor may also be composed of different materials such as, for example, graphite or silicon carbide. All parts which have not been mentioned before but may be present in the hot region and come into contact with the gas stream should likewise preferably be composed of the above-mentioned advantageous metals or metal compounds or at least be coated with the same. The advantageous material selection that has been described ensures that the gas stream which flows past detaches no carbon atoms from the contact areas, such as the inner wall surface of the container or the carrier surface, or takes up carbon atoms that have emerged and takes them to the silicon carbide semiconductor.

In accordance with still another mode of the invention, an implantation-doped silicon carbide semiconductor is brought to a maximum temperature of at least 1000° C. by supplying heat. The increase in temperature with respect to time (heating rate) is generally restricted to at most 100° C./min, preferably to at most 30° C./min, during this heating process.

In accordance with still a further mode of the invention, the maximum temperature is advantageously set between 1100° C. and 1800° C., preferably between 1400° C. and 1750° C.

In accordance with still an added mode of the invention, the silicon carbide semiconductor is advantageously kept at least approximately at the maximum temperature for a predetermined time interval of preferably between 2 min and 60 min, in particular between 15 min and 30 min. This high temperature plateau provides an improvement in the activation coefficient of dopants in the silicon carbide semiconductor.

In accordance with still an additional mode of the invention, the cooling rate is advantageously limited to at most 100° C./min, in particular to at most 30° C./min. The slow cooling operation expediently ends at an intermediate temperature of preferably below 600° C. The restriction of the rates of temperature change (heating and cooling rates) leads to improved electrical properties of the silicon carbide semiconductor which is doped by implantation and then annealed.

The heating and/or cooling rate need not be constant, but rather may also advantageously vary within ranges defined by an upper limit of 100° C./min and, in particular, by an upper limit of 30° C./min.

In accordance with a concomitant mode of the invention, during the heating and cooling operations, the temperature of the silicon carbide semiconductor is kept in each case at a predetermined temperature level in each case at least once. The heating and cooling rate, respectively, is practically 0° C./min during the period of time at which this temperature level is maintained.

Other features which are considered as characteristic for the invention are set forth in the appended claims.

Although the invention is illustrated and described herein as embodied in a process for the thermal annealing of implantation-doped silicon carbide semiconductors, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
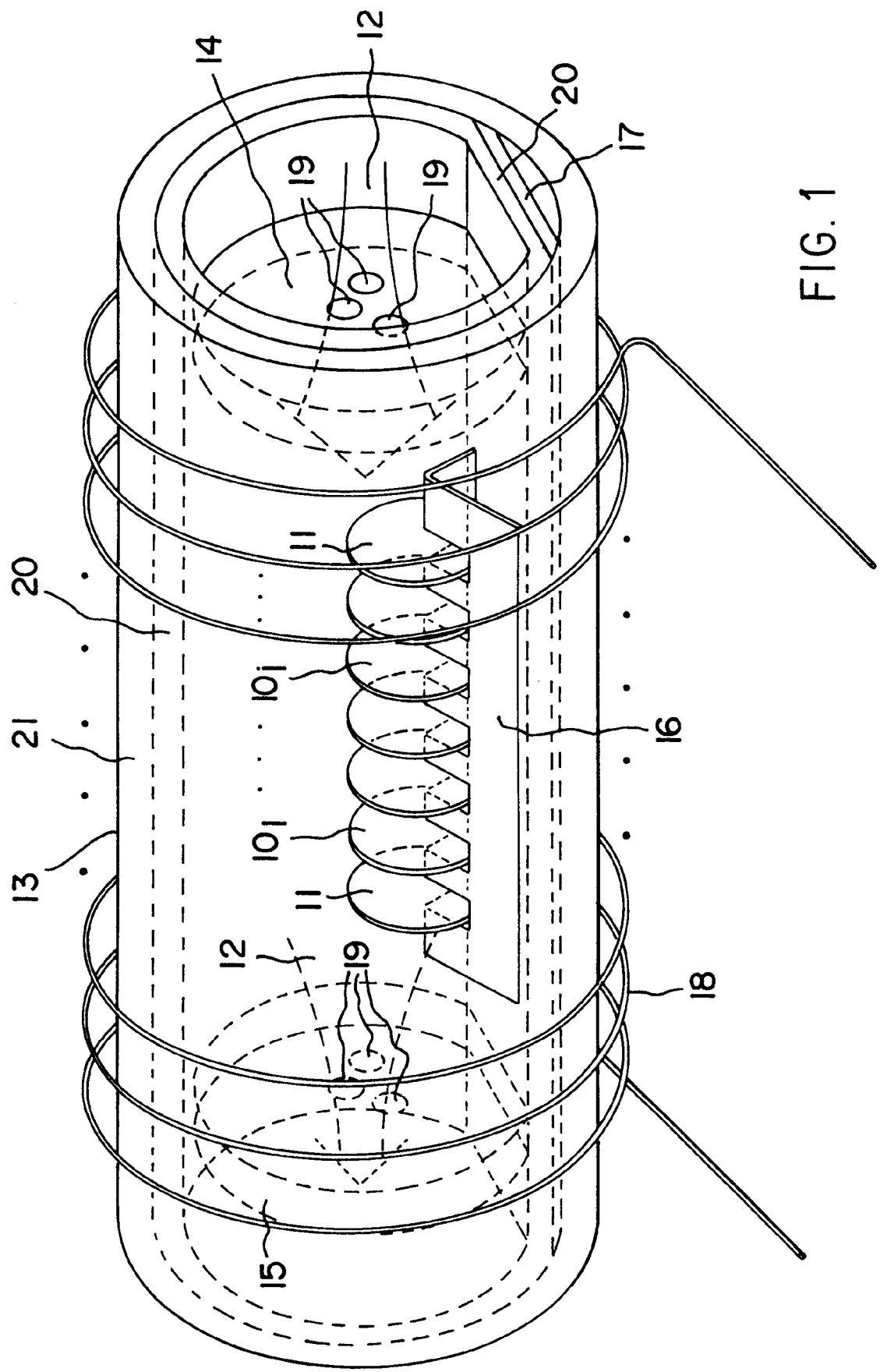
FIG. 1 is a diagrammatic, perspective view of a container having an interior in which there is at least one silicon carbide semiconductor for the thermal annealing of lattice defects caused by a preceding implantation.
Figure 2:
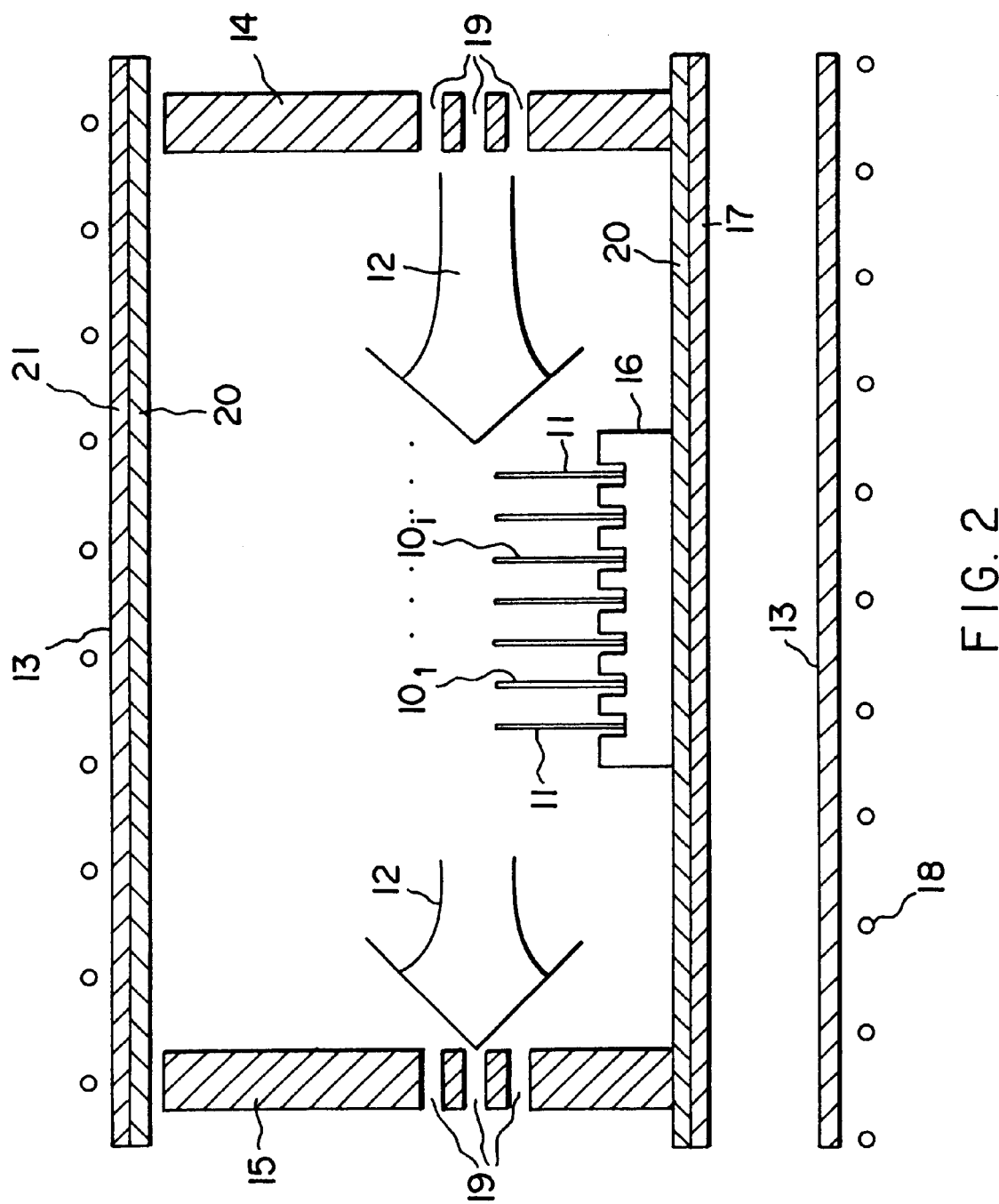
FIG. 2 is a longitudinal-sectional view of the configuration of FIG. 1.

Referring now in detail to the figures of the drawings, in which mutually corresponding parts are provided with the same reference symbols, and first, particularly, to FIG. 1 thereof, there is seen a perspective illustration of a container 13 having an interior space in which there are, by way of example, a plurality of silicon carbide semiconductors $10_i$ (where i=1, . . . ) for thermal annealing after a preceding ion implantation. FIG. 2 shows a longitudinal section through the configuration of FIG. 1. The container 13 has a cylindrical structure in the embodiment shown, but it can also equally well be constructed with a different geometrical form, for example as an elongate parallelepiped.

The silicon carbide semiconductors $10_i$ as shown in FIGS. 1 and 2 may have been produced, prior to the illustrated thermal annealing, by the following process steps to be implemented successively:

1. provision of a monocrystalline silicon carbide substrate,
2. optional: epitaxial growth of a silicon carbide layer on the substrate, and
3. production of at least one doping region by possibly repeated, successive implantation of doping atoms.

A sublimation growth process is preferably used for providing the silicon carbide substrate. The silicon carbide substrate is essentially composed of a single silicon carbide polytype, in particular of beta-silicon carbide (3C-silicon carbide, cubic silicon carbide) or one of the polytypes of alphasilicon carbide (hexagonal or rhombohedral silicon carbide). Preferred polytypes for the silicon carbide substrate are the alpha-silicon carbide polytypes 4H, 6H and 15R.

An epitaxy process that is known per se, preferably an epitaxy by chemical vapor deposition (CVD), is used in order to deposit the silicon carbide layer on the silicon carbide substrate. By way of example, a CVD epitaxy process may be used in accordance with U.S. Pat. No. 5,011,549. Due to the epitaxial growth, the silicon carbide layer is, like the silicon carbide substrate, monocrystalline and therefore semiconducting. If the growth conditions during the epitaxy are set appropriately, the silicon carbide layer is also of a single polytype, which is the same as the polytype of the silicon carbide substrate. If the silicon carbide substrate is composed of alpha-silicon carbide, then it is generally prepared before the deposition of the silicon carbide layer, for example by cutting and/or grinding, in such a way that the substrate surface provided as a growth surface is inclined by an angle of between approximately 1° and approximately 12° away from the (0001) plane, preferably in the direction of one of the <11$\bar{2}$0> crystal directions. The effect achieved by such "misorientation" ("off-orientation") of the growth surface with respect to the natural crystal surfaces (basal planes), namely the (0001) crystal surface referred to as the silicon side or the (000$\bar{1}$) crystal surface referred to as the carbon side, in conjunction with suitable growth temperatures of typically 1500° C., is that the silicon carbide layer is of the same alpha-silicon carbide polytype as the silicon carbide substrate and, in particular, exhibits no syntaxy. The silicon carbide layer may be doped according to a desired conduction type by adding corresponding dopant compounds during the growth.

In order to produce different doping regions, an implantation process is used in which one or more dopants is or are introduced into the silicon carbide semiconductors $10_i$. First of all, the silicon carbide semiconductors $10_i$ may be provided with implantation masks. The silicon carbide semiconductors $10_i$ are then introduced into a non-illustrated implantation installation. In the implantation installation, the surfaces of the silicon carbide semiconductors $10_i$ are bombarded with ions of one or more dopants with energies of typically between 10 keV and a few 100 keV depending on the dopants used and the desired penetration depth. During the implantation, the silicon carbide semiconductors $10_i$ are kept at temperatures in a range of between approximately 20° C. (room temperature) and approximately 1200° C., preferably between approximately 20° C. and approximately 600° C.

The silicon carbide crystal lattice in the different doping regions of the silicon carbide semiconductors $10_i$ is damaged by the dopant particles penetrating the silicon carbide crystal of the silicon carbide layer with high energy. In order to provide at least partial "repair" and recovery of the crystal defects created by the implantation, the silicon carbide semiconductors $10_i$ are then annealed by a thermal annealing process.

In order to provide the thermal annealing, the silicon carbide semiconductors $10_i$ are introduced into the container 13 of a non-illustrated annealing installation (annealing furnace, heat-treatment furnace) and are disposed on a carrier 16 in a gas stream 12 in the container 13.

Apparatuses, which are not illustrated in FIGS. 1 and 2, for thermal insulation and for guiding the gas, for example a double-walled water-cooled quartz tube, are fitted outside the container 13. The apparatus for guiding the gas prevents, inter alia, undesirable lateral emergence of gas through the wall of the container 13. Furthermore, a controllable induction heating configuration with at least one HF induction coil 18, through the use of which the container 13 is inductively heated, is advantageously provided around the container 13 and around the above-mentioned apparatuses that are not illustrated. The silicon carbide semiconductors $10_i$ in the interior of the container 13 are also heated uniformly by this measure. It is also possible, however, to produce a resistance heating configuration.

The container 13 illustrated in FIGS. 1 and 2 is advantageously constructed with at least two layers. One container layer 21, which forms an outer supporting wall, is preferably composed of graphite. As a result, on one hand, the container 13 can be heated particularly well through the use of the HF induction coil, since the good conductivity of graphite promotes the formation of eddy currents, and the container 13 is heated as a consequence thereof. On the other hand, the outer container layer 21 made of graphite constitutes a very good black-body radiator through the use of which the present temperature of the container 13 can be detected contactlessly in a simple manner. However, in the interior of the container 13 it is more advantageous to provide a coating 20 (see FIG. 2) made of tantalum or tantalum carbide, since the gas stream 12 should advantageously take up no carbon atoms from the inner wall surface of the container and supply them to the silicon carbide semiconductors $10_i$. The thickness of this coating is generally greater than 0.01 mm. The undesirable growth of the crystallographic steps is thereby suppressed in contrast to known all-graphite containers or graphite containers coated with silicon carbide. Other metals or metal compounds are also suitable for the coating 20, with the special process conditions during thermal annealing being taken into account. Accordingly, in addition to those already mentioned, metals or metal compounds which contain at least proportions of tungsten, molybdenum, niobium, rhenium, osmium, iridium, or carbides thereof, are suitable, in particular. Just like the container 13, the carrier 16, which holds the silicon carbide semiconductors $10_i$, is also preferably composed of the above-mentioned metals or metal compounds in its entirety or at least at the locations which are touched by the gas stream 12. The carrier 16 may stand on a baseplate 17, which is advantageously likewise provided with a coating 20 made of the above-mentioned metals or metal compounds, at least at the surface which faces the region through which the gas stream flows. Radiation shields 14 and 15 are provided in the interior space of the container at ends of the container 13. The shields are provided with openings 19, through which the gas stream 12 is conducted in and out. The radiation shields 14 and 15 preferably include a plurality of individual elements, for example perforated disks set up one behind the other, which preferably extend as near as possible to the inner wall surface of the container. This enables them to fulfil their purpose particularly well, namely that of protecting the interior space of the container against heat loss due to radiation. The radiation shields 14 and 15 are in turn preferably composed of the above-mentioned metals or metal compounds.

In another non-illustrated preferred embodiment, the container 13 and the baseplate 17 are formed in one layer and not in two layers. That one layer is then composed of the above-mentioned metals or metal compounds.

It has proved to be particularly advantageous if the gas stream 12 is preheated as it passes through the radiation shield 14, for example through the use of advantageous shaping of the individual elements. As a result, the gas stream 12 does not cool the silicon carbide semiconductors $10_i$, in an undesirable manner. This is because, by adhering to the temperature profiles which have been identified as advantageous at the silicon carbide semiconductors $10_i$, it is possible to obtain particularly good results during the annealing of the implantation damage. In consequence, this results in an improved blocking behavior of p-n junctions that may have been introduced in the silicon carbide semiconductors $10_i$, for example during the preceding non-illustrated doping processes.

Instead of the configuration in a row as illustrated in FIGS. 1 and 2, the silicon carbide semiconductors $10_i$ can preferably also be placed in such a way that they are offset laterally with respect to one another. In a further non-illustrated embodiment, those surfaces of the silicon carbide semiconductors $10_i$ which are to be annealed can, instead of being oriented perpendicularly in the manner shown in FIGS. 1 and 2, also advantageously be disposed in such a way that they are rotated, inclined or, in particular, parallel with respect to the main flow direction of the gas stream 12. These embodiments lead to better and more uniform flow circulation, with the result that the carbon and silicon atoms exiting from the silicon carbide semiconductors $10_i$ can more easily be picked up by the gas stream 12 and transported away. The undesirable growth of the crystallographically oriented steps is thus avoided. The parallel embodiment variant is achieved in a particularly simple manner if the carrier 16 shown in FIG. 1 is rotated through 90° in terms of its orientation with respect to the gas stream 12. A further non-illustrated embodiment manages without a separate carrier 16 for retaining the silicon carbide semiconductors $10_i$. In this variant, the silicon carbide semiconductors $10_i$ advantageously lie in recesses in the baseplate 17. As a result, those surfaces of the silicon carbide semiconductors $10_i$ which are to be annealed are again oriented parallel to the main flow direction of the gas stream 12. In an advantageous variant of this embodiment that is not illustrated, a plurality of baseplates 17 with recesses are stacked one above the other, thereby enabling a greater throughput to be achieved.

In the case of the illustrated embodiment, with the silicon carbide semiconductors $10_i$ being disposed perpendicularly to the gas stream 12, it has proved to be particularly favorable to equip at least the first and the last retaining positions of the carrier 16 with dummy silicon carbide semiconductors 11, which actually ought not to be subjected to an annealing process. These dummy silicon carbide semiconductors 11 serve to ensure that all of the silicon carbide semiconductors $10_i$ which are to be annealed are treated under identical and reproducible gas flow conditions.

The dummy silicon carbide semiconductors 11, which act virtually as protective shields, shield the silicon carbide semiconductors 10; from vortex flows which can occur at two edge zones of the carrier 16. The dummy silicon carbide semiconductors 11 also act as additional radiation shields.

A silicon carbide semiconductor annealed by a thermal annealing process according to the invention can advantageously be used to construct different semiconductor components, preferably silicon carbide-based power semiconductor components. Examples of such semiconductor components are p-n diodes, bipolar transistors, MOSFETs, thyristors, IGBTs or MCTs.

Furthermore, the implantation process and the annealing process can be carried out successively in a single installation which is planned for both processes.

We claim:

1. In a process for the thermal annealing of at least one implantation-doped silicon carbide semiconductor in a gas stream, the improvement which comprises:

holding the at least one silicon carbide semiconductor with a carrier within a container;

conducting the gas stream within the container causing the gas stream to contact regions of the carrier and the container;

forming the carrier and the container of a material selected from the group consisting of at least one metal and at least one metal compound, at least in the regions; and supplying practically no carbon to the at least one silicon carbide semiconductor through the gas stream.

2. The process according to claim 1, which further comprises at least occasionally providing the gas stream with nitrogen.

3. The process according to claim 1, which further comprises at least occasionally providing the gas stream with at least one inert gas.

4. The process according to claim 3, which further comprises selecting the inert gas from the group consisting of argon and helium.

5. The process according to claim 1, which further comprises at least occasionally providing the gas stream with at least one inert gas and nitrogen.

6. The process according to claim 5, which further comprises selecting the inert gas from the group consisting of argon and helium.

7. The process according to claim 1, which further comprises at least occasionally providing the gas stream with hydrogen.

8. The process according to claim 1, which further comprises adding an element, used as a dopant for the at least one silicon carbide semiconductor, to the gas stream.

9. The process according to claim 1, which further comprises setting a flow rate of the gas of between 0.5 cm/s and 60 cm/s.

10. The process according to claim 1, which further comprises setting a flow rate of the gas of between 5 cm/s and 25 cm/s.

11. The process according to claim 1, which further comprises forming a gas atmosphere, with a static process pressure of between 5000 Pa and 100,000 Pa, at the at least one silicon carbide semiconductor.

12. The process according to claim 1, which further comprises forming a gas atmosphere, with a static process pressure of between 10,000 Pa and 50,000 Pa, at the at least one silicon carbide semiconductor.

13. The process according to claim 1, which further comprises providing the material selected from the group consisting of at least one metal and at least one metal compound with a melting point above 1800° C.

14. The process according to claim 1, which further comprises providing the material selected from the group consisting of at least one metal and at least one metal compound with a vapor pressure of less than $10^{-2}$ at a temperature of 1800° C.

15. The process according to claim 1, which further comprises selecting the material from the group consisting of a hydrogen-resistant metal and a hydrogen-resistant metal compound.

16. The process according to claim 1, which further comprises adding a material selected from the group consisting of at least one of the elements tantalum, tungsten, molybdenum, niobium, rhenium, osmium and iridium and a carbide of at least one of the elements, in the material selected from the group consisting of at least one metal and at least one metal compound.

17. The process according to claim 1, which further comprises heating the container.

18. The process according to claim 1, which further comprises inductively heating the container.

19. The process according to claim 1, which further comprises preheating the gas stream as it enters into the interior of the container.

20. The process according to claim 1, which further comprises carrying out the step of conducting the gas stream within the container in a given direction, providing at least one radiation shield upstream and at least one radiation shield downstream of the carrier within the container, as seen in the given direction, causing the gas stream to contact given regions of the radiation shields, and forming the radiation shields of a material selected from the group consisting of at least one metal and at least one metal compound, at least in the given regions.

21. The process according to claim 20, which further comprises providing openings in the radiation shields, and passing the gas stream through the openings.

22. The process according to claim 20, which further comprises providing the material selected from the group consisting of at least one metal and at least one metal compound with a melting point above 1800° C.

23. The process according to claim 20, which further comprises providing the material selected from the group consisting of at least one metal and at least one metal compound with a vapor pressure of less than $10^{-2}$ at a temperature of 1800° C.

24. The process according to claim 20, which further comprises selecting the material from the group consisting of a hydrogen-resistant metal and a hydrogen-resistant metal compound.

25. The process according to claim 20, which further comprises adding a material selected from the group consisting of at least one of the elements tantalum, tungsten, molybdenum, niobium, rhenium, osmium and iridium and a carbide of at least one of the elements, in the material selected from the group consisting of at least one metal and at least one metal compound.

26. The process according to claim 1, which further comprises heating the at least one silicon carbide semiconductor at a heating rate of at most 100° C./min to a maximum temperature of at least 1000° C.

27. The process according to claim 26, which further comprises setting the maximum temperature to between 1100° C. and 1800° C.

28. The process according to claim 26, which further comprises setting the maximum temperature to between 1400° C. and 1750° C.

29. The process according to claim 26, which further comprises keeping the temperature of the at least one silicon carbide semiconductor at the maximum temperature for a time interval of between 2 min and 60 min.

30. The process according to claim 26, which further comprises cooling the at least one silicon carbide semiconductor, starting from the maximum temperature, at a cooling rate of at most 100° C./min, to an intermediate temperature of at most 600° C.

31. The process according to claim 26, which further comprises cooling the at least one silicon carbide semiconductor, starting from the maximum temperature, at a cooling rate of at most 30° C./min, to an intermediate temperature of at most 600° C.

32. The process according to claim 26, which further comprises keeping the temperature of the at least one silicon carbide semiconductor at a respective temperature level at least once during each heating and cooling operation.

33. The process according to claim 1, which further comprises heating the at least one silicon carbide semiconductor at a heating rate of at most 30° C./min to a maximum temperature of at least 1000° C.

34. The process according to claim 33, which further comprises setting the maximum temperature to between 1100° C. and 1800° C.

35. The process according to claim 33, which further comprises setting the maximum temperature to between 1400° C. and 1750° C.

36. The process according to claim 33, which further comprises keeping the temperature of the at least one silicon carbide semiconductor at the maximum temperature for a time interval of between 2 min and 60 min.

37. The process according to claim 33, which further comprises cooling the at least one silicon carbide semiconductor, starting from the maximum temperature, at a cooling rate of at most 100° C./min, to an intermediate temperature of at most 600° C.

38. The process according to claim 33, which further comprises cooling the at least one silicon carbide semiconductor, starting from the maximum temperature, at a cooling rate of at most 30° C./min, to an intermediate temperature of at most 600° C.

39. The process according to claim 33, which further comprises keeping the temperature of the at least one silicon carbide semiconductor at a respective temperature level at least once during each heating and cooling operation.

\* \* \* \* \*